(12) United States Patent
Zhang et al.

(10) Patent No.: US 11,088,224 B2
(45) Date of Patent: Aug. 10, 2021

(54) DISPLAY SUBSTRATE, METHOD FOR MANUFACTURING THE SAME AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zhen Zhang, Beijing (CN); Kangguan Pan, Beijing (CN); Yulong Wei, Beijing (CN); Kwanggyun Jang, Beijing (CN); Sanghun Kang, Beijing (CN); Jun Yan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 16/407,161

(22) Filed: May 8, 2019

(65) Prior Publication Data

US 2020/0020753 A1    Jan. 16, 2020

(30) Foreign Application Priority Data

Jul. 16, 2018  (CN) .......................... 201810778014.4

(51) Int. Cl.
 *H01L 27/32* (2006.01)
 *G06K 9/00* (2006.01)
 *H01L 51/52* (2006.01)

(52) U.S. Cl.
 CPC ........ *H01L 27/3234* (2013.01); *G06K 9/0004* (2013.01); *H01L 27/3272* (2013.01);
 (Continued)

(58) Field of Classification Search
 None
 See application file for complete search history.

(56) References Cited

U.S. PATENT DOCUMENTS

2016/0370580 A1  12/2016  Takada et al.
2017/0255810 A1   9/2017  Liu et al.
(Continued)

FOREIGN PATENT DOCUMENTS

CN       1901220 A    1/2007
CN     101866075 A   10/2010
(Continued)

OTHER PUBLICATIONS

First Chinese Office Action dated Mar. 16, 2020, received for corresponding Chinese Application No. 2018107780144, 12 pages.
(Continued)

*Primary Examiner* — Robert K Carpenter
(74) *Attorney, Agent, or Firm* — Kinney & Lange, P.A.

(57) ABSTRACT

A display substrate, a manufacturing method and a display device are disclosed. The display substrate includes a base substrate, and a light-shielding layer and a plurality of light-emitting units arranged at a display region of the base substrate. A plurality of imaging pin-holes is formed in the light-shielding layer, an orthogonal projection of each imaging pin-hole onto the base substrate does not overlap an orthogonal projection an active light-emitting region of the corresponding light-emitting unit onto the base substrate, and at least a part of a surface of the light-shielding layer adjacent to the light-emitting units is uneven.

20 Claims, 5 Drawing Sheets

(52) U.S. Cl.
CPC ...... *H01L 51/5209* (2013.01); *H01L 51/5218* (2013.01); *H01L 2227/323* (2013.01)

(56) References Cited

U.S. PATENT DOCUMENTS

| | | |
|---|---|---|
| 2018/0211085 A1 | 6/2018 | Liu et al. |
| 2019/0006440 A1 | 1/2019 | Sun et al. |

FOREIGN PATENT DOCUMENTS

| | | | | |
|---|---|---|---|---|
| CN | 105304656 A | * | 2/2016 | ........... G06K 9/0004 |
| CN | 105373772 A | | 3/2016 | |
| CN | 105678255 A | | 6/2016 | |
| CN | 106062588 A | | 10/2016 | |
| CN | 107154381 A | | 9/2017 | |
| CN | 108242453 A | | 7/2018 | |

OTHER PUBLICATIONS

Second Chinese Office Action dated Oct. 13, 2020, for corresponding Chinese Application No. 201810778014.4.

* cited by examiner

DISPLAY SUBSTRATE, METHOD FOR MANUFACTURING THE SAME AND DISPLAY DEVICE

CROSS-REFERENCE TO RELATED APPLICATION

The present application claims a priority of the Chinese patent application No. 201810778014.4 filed on Jul. 16, 2018, which is incorporated herein by reference in its entirety.

TECHNICAL FIELD

The present disclosure relates to the field of display technology, in particular to a display substrate, a method for manufacturing the same and a display device.

BACKGROUND

As a research hotspot, an in-screen fingerprint identification technology is adopted to further reduce a size of a lower bezel of a display screen, thereby to achieve a display function in a full screen manner. In addition, through the in-screen fingerprint identification technology, it is able to provide better resistance to oil, water and dust. Among various in-screen fingerprint identification schemes, a pinhole imaging scheme has attracted more and more attention due to its high resolution.

However, for a current pin-hole imaging scheme, due to the existence of stray light, a fuzzy fingerprint may be collected, and thereby the fingerprint identification may be performed inaccurately.

SUMMARY

In one aspect, the present disclosure provides in some embodiments a display substrate, including a base substrate, and a light-shielding layer and a plurality of light-emitting units arranged at a display region of the base substrate. A plurality of imaging pin-holes is formed in the light-shielding layer, an orthogonal projection of the plurality of imaging pin-holes onto the base substrate does not overlap an orthogonal projection of an active light-emitting region of the plurality of light-emitting units onto the base substrate, and at least a part of a surface of the light-shielding layer adjacent to the plurality of light-emitting units is uneven.

In a possible embodiment of the present disclosure, the entire surface of the light-emitting layer adjacent to the plurality of light-emitting units is uneven.

In a possible embodiment of the present disclosure, each light-emitting unit includes an anode, a light-emitting layer and a cathode. The display substrate further includes: a thin film transistor including a drain electrode, the light-shielding layer being arranged between the drain electrode and the anode; and a conductive connection pattern arranged at a same layer as but not connected to the light-shielding layer and configured to connect the anode and the drain electrode.

In a possible embodiment of the present disclosure, the anode is a reflective anode provided with a plurality of through-holes corresponding to the plurality of imaging pin-holes respectively and arranged above the plurality of imaging pin-holes, and an orthogonal projection of a gap between the light-shielding layer and the conductive connection pattern onto the base substrate is completely located within an orthogonal projection of the anode onto the base substrate.

In a possible embodiment of the present disclosure, the display substrate includes: the base substrate; a thin film transistor arranged at a side of the base substrate and including a drain electrode; a first insulation layer arranged on the thin film transistor, a first connection hole being formed in the first insulation layer and arranged above the drain electrode; the light-shielding layer and the conductive connection pattern arranged on the first insulation layer, at least a part of a surface of the light-shielding layer adjacent to the light-emitting layer being uneven, the plurality of imaging pin-holes being formed in the light-shielding layer, an orthogonal projection of each imaging pin-hole onto the base substrate not overlapping an orthogonal projection of an active light-emitting region of the corresponding light-emitting unit onto the base substrate, the light-shielding layer being made of a conductive material, the conductive connection pattern being arranged at a same layer as and not connected to the light-shielding layer, at least a part of the conductive connection pattern being arranged in the first connection hole, and the conductive connection pattern being connected to the drain electrode via the first connection hole; a second insulation layer arranged on the light-shielding layer, a second connection hole being formed in the second insulation layer and arranged above the conductive connection pattern; an anode arranged on the second insulation layer and connected to the conductive connection pattern via the second connection hole, the anode being a reflective anode and provided with a plurality of through-holes, the through-holes corresponding to the imaging pin-holes respectively and each arranged above the corresponding imaging pin-hole, and an orthogonal projection of a gap between the light-shielding layer and the conductive connection pattern onto the base substrate being completely arranged within an orthogonal projection of the anode onto the base substrate; a light-emitting layer arranged on the anode; a cathode arranged on the light-emitting layer; and a fingerprint sensor arranged at the other side of the base substrate.

In a possible embodiment of the present disclosure, the conductive material is a metal material.

In a possible embodiment of the present disclosure, the display substrate further includes a fingerprint sensor arranged on the base substrate and at a side of the light-shielding layer away from the light-emitting unit.

In another aspect, the present disclosure provides in some embodiments a display device including the above-mentioned display substrate.

In yet another aspect, the present disclosure provides in some embodiments a method for manufacturing a display substrate, including: providing a base substrate; and forming a light-shielding layer and a plurality of light-emitting units at a display region of the base substrate. A plurality of imaging pin-holes is formed in the light-shielding layer, an orthogonal projection of each imaging pin-hole onto the base substrate does not overlap an orthogonal projection of an active light-emitting region of the light-emitting unit onto the base substrate, and at least a part of a surface of the light-shielding layer adjacent to the light-emitting units is uneven.

In a possible embodiment of the present disclosure, the entire surface of the light-shielding layer adjacent to the light-emitting units is uneven.

In a possible embodiment of the present disclosure, each light-emitting unit includes an anode, a light-emitting layer and a cathode. Prior to forming the light-shielding layer and the plurality of light-emitting units at the display region of the base substrate, the method further includes forming a thin film transistor on the base substrate. The thin film transistor includes a drain electrode, and the light-shielding layer is arranged between the drain electrode and the anode of the light-emitting unit. The method further includes forming a conductive connection pattern on the base substrate. The conductive connection pattern is arranged at a same layer as and not connected to the light-shielding layer, and configured to connect the anode and the drain electrode.

In a possible embodiment of the present disclosure, the anode is a reflective anode provided with a plurality of through-holes corresponding to the imaging pin-holes respectively and each arranged above the corresponding imaging pin-hole, and an orthogonal projection of a gap between the light-shielding layer and the conductive connection pattern onto the base substrate is completely located within an orthogonal projection of the anode onto the base substrate.

In a possible embodiment of the present disclosure, the method includes: providing the base substrate; forming a thin film transistor at a side of the base substrate, the thin film transistor including a drain electrode; forming a first insulation layer on the thin film transistor, a first connection hole being formed in the first insulation layer and arranged above the drain electrode; forming the light-shielding layer and the conductive connection pattern on the first insulation layer through a single patterning process, at least a part of a surface of the light-shielding layer adjacent to the light-emitting layer being uneven, the plurality of imaging pin-holes being formed in the light-shielding layer, an orthogonal projection of each imaging pin-hole onto the base substrate not overlapping an orthogonal projection of an active light-emitting region of the corresponding light-emitting unit onto the base substrate, the light-shielding layer being made of a conductive material, the conductive connection pattern being arranged at a same layer as and not connected to the light-shielding layer, at least a part of the conductive connection pattern being arranged in the first connection hole, and the conductive connection pattern being connected to the drain electrode via the first connection hole; forming a second insulation layer on the light-shielding layer, a second connection hole being formed in the second insulation layer and arranged above the conductive connection pattern; forming an anode on the second insulation layer, the anode being connected to the conductive connection pattern via the second connection hole, the anode being a reflective anode and provided with a plurality of through-holes, the through-holes corresponding to the imaging pin-holes respectively and each arranged above the corresponding imaging pin-hole, and an orthogonal projection of a gap between the light-shielding layer and the conductive connection pattern onto the base substrate being completely arranged within an orthogonal projection of the anode onto the base substrate; forming a light-emitting layer on the anode; forming a cathode on the light-emitting layer; and forming a fingerprint sensor at the other side of the base substrate.

In a possible embodiment of the present disclosure, the conductive material is a metal material.

In a possible embodiment of the present disclosure, the forming the first insulation layer on the thin film transistor includes forming an insulation film, and patterning the insulation film through a grey-tone or half-tone mask plate so as to form a pattern of the first insulation layer with the first connection hole. At least a part of an upper surface of the first insulation layer adjacent to the light-shielding layer is provided with an uneven structure.

In a possible embodiment of the present disclosure, the forming the first insulation layer on the thin film transistor includes forming an insulation film, patterning the insulation film so as to form a pattern of the first insulation layer with the first connection hole, and subjecting the first insulation layer to ashing treatment so as to provide an entire upper surface of the first insulation layer with an uneven structure.

In a possible embodiment of the present disclosure, the forming the light-shielding layer on the first insulation layer includes forming a conductive film, and patterning the conductive film through a grey-tone or half-tone mask plate so as to form the light-shielding layer and the conductive connection pattern. The plurality of imaging pin-holes is formed in the light-shielding layer, and an upper surface of the light-shielding layer is provided with an uneven structure.

In a possible embodiment of the present disclosure, the forming the light-shielding layer on the first insulation layer includes: patterning the conductive film so as to form the light-shielding layer and the conductive connection pattern, the plurality of imaging pin-holes being formed in the light-shielding layer; and etching a surface of the light-shielding layer and a surface of the conductive connection pattern through an etching process so as to provide the entire surface of the light-shielding layer and the conductive connection pattern with an uneven structure.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
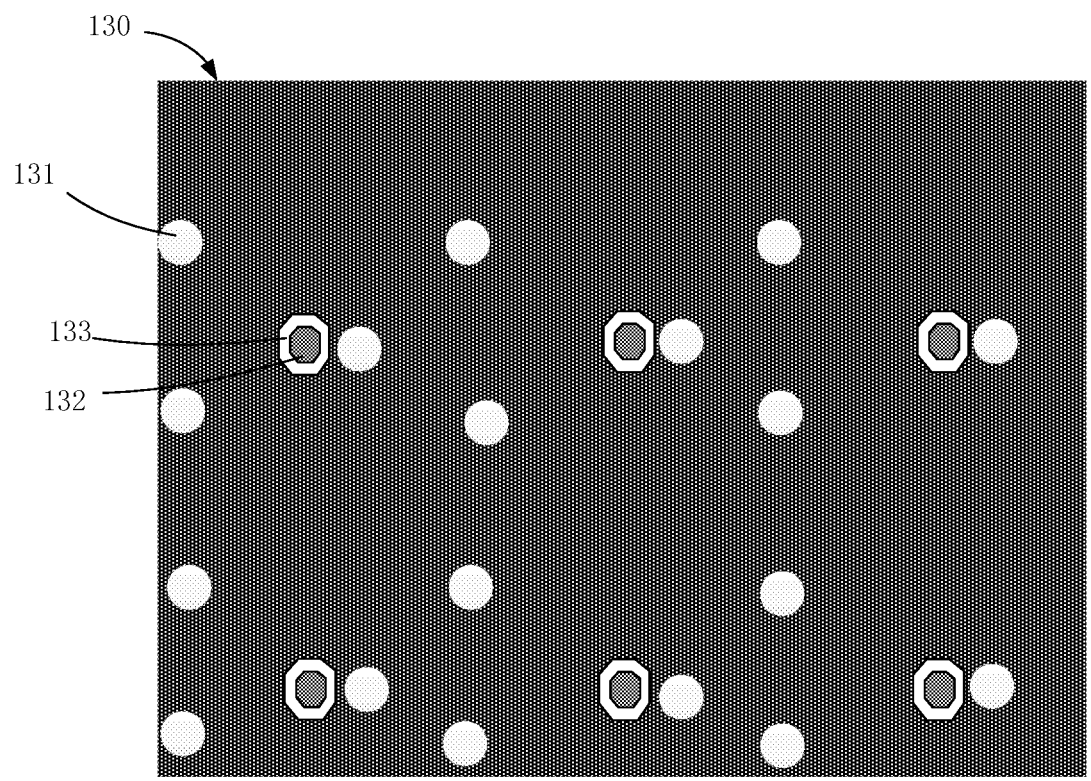
FIG. 1 is a schematic view showing a light-shielding layer according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In order to prevent the collection of a fingerprint from being adversely affected by stray light and improve the fingerprint identification performance, the present disclosure provides in some embodiments a display substrate, which includes a base substrate, and a light-shielding layer and a plurality of light-emitting units arranged at a display region of the base substrate. A plurality of imaging pin-holes is formed in the light-shielding layer, an orthogonal projection of each imaging pin-hole onto the base substrate does not overlap an orthogonal projection an active light-emitting region of the corresponding light-emitting unit onto the base substrate, and at least a part of a surface of the light-shielding layer adjacent to the light-emitting units is uneven.

In the embodiments of the present disclosure, each light-emitting unit may be an organic light-emitting diode (OLED), which includes an anode, a light-emitting layer and a cathode. The active light-emitting region of the light-emitting unit is a region where the anode and the light-emitting layer completely overlap each other.

According to the embodiments of the present disclosure, the imaging pin-holes for the collection of a fingerprint are located at a display region of the display substrate, so it is able to achieve the in-screen fingerprint identification without any necessity to form the imaging pin-holes at a non-display region of the display substrate, thereby to reduce a size of a bezel of a display device including the display substrate, achieve a display function in a full screen manner, and provide better resistance to oil, water and dust. In addition, at least a part of the surface of the light-shielding layer adjacent to the light-emitting unit is uneven, so it is able to reduce the reflectivity of the surface of the light-shielding layer, and prevent the stray light from being reflected by the light-shielding layer and entering a fingerprint sensor through the imaging pin-holes or any other portions of the light-shielding layer where the light leakage may occur, thereby to collect the fingerprint in a clearer manner and perform the fingerprint identification accurately.

In a possible embodiment of the present disclosure, the entire surface of the light-shielding layer adjacent to the light-emitting units may be uneven, so as to further reduce the reflectivity of the light-shielding layer.

Of course, in some embodiments of the present disclosure, parts of the surface of the light-shielding layer adjacent to the light-emitting units may be uneven. In a possible embodiment of the present disclosure, the parts of the surfaces of the light-shielding layer may surround the respective imaging pin-holes or the other portions of the light-shielding layer where the light leakage may occur.

In the embodiments of the present disclosure, the light-shielding layer may be made of metal, or any other light-shielding material.

In the embodiments of the present disclosure, each light-emitting unit may be an OLED, which includes an anode, a light-emitting layer and a cathode. In addition, the display substrate may further include a thin film transistor, and the anode is connected to a drain electrode of the thin film transistor so as to acquire an electric signal. In a possible embodiment of the present disclosure, the light-shielding layer may be arranged between the anode and the drain electrode. In addition, a conductive connection pattern is arranged at a same layer as the light-shielding layer, so that the anode is connected to the drain electrode via the conductive connection pattern.

In a possible embodiment of the present disclosure, the light-shielding layer may be made of a same conductive material, e.g., metal, as the conductive connection pattern, so as to form the light-shielding layer and the conductive connection pattern through a single patterning process, thereby to reduce the manufacture cost. In another possible embodiment of the present disclosure, the light-shielding layer and the conductive connection pattern may be made of a same metal material as the drain electrode, so as to further reduce the manufacture cost. In order to prevent the occurrence of short circuit for the anode, the light-shielding layer may be insulated from the conductive connection pattern, so there may exist the other portions for the light-shielding layer where the light leakage occurs.

Figure 2:
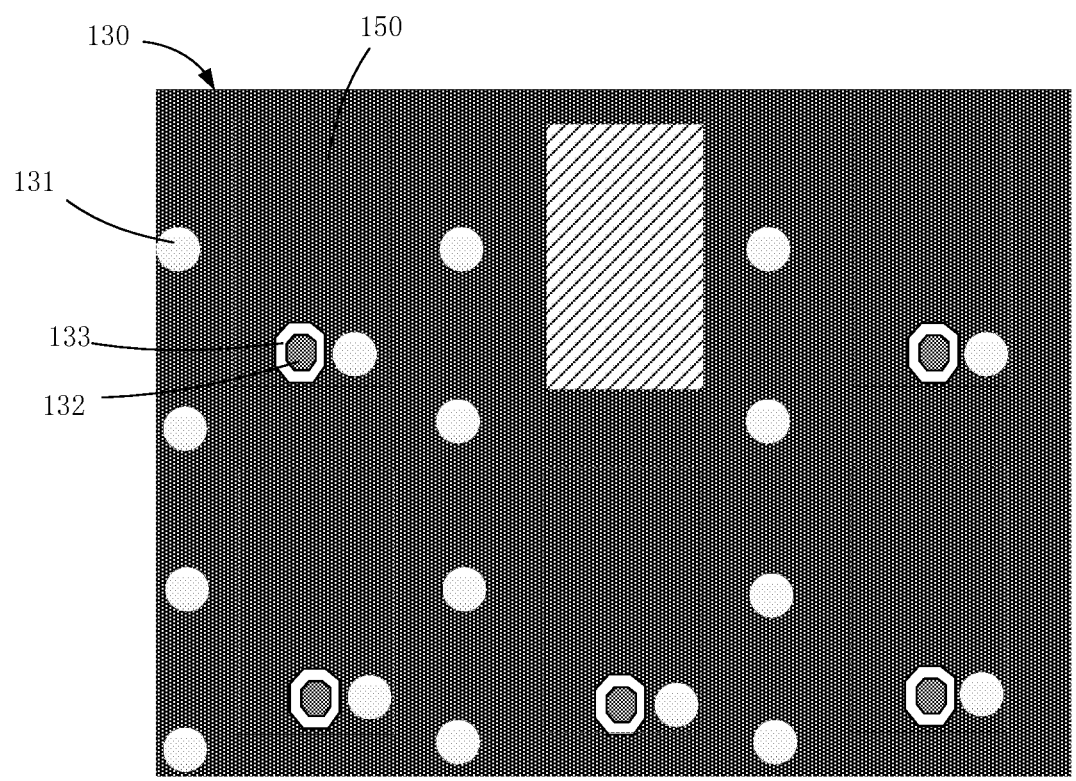
FIG. 2 is a schematic view showing a position relationship between the light-shielding layer and an anode according to one embodiment of the present disclosure.

As shown in FIG. 1, the plurality of imaging pin-holes 131 is formed in the light-shielding layer 130. The light-shielding layer 130 is insulated from the conductive connection pattern 132 which is arranged at a same layer as the light-shielding layer 130, and a gap 133 is formed between the light-shielding layer 130 and the conductive connection pattern 132. As shown in FIG. 2 which shows a position relationship between the light-shielding layer and the anode, the anode 150 is arranged above the light-shielding layer 130, connected to the conductive connection pattern 132, and thereby connected to the drain electrode.

The light leakage may occur at the gap between the light-shielding layer and the conductive connection pattern. Hence, the anode needs to be a reflective anode. A plurality of through-holes may be formed in the anode and correspond to the imaging pin-holes respectively, and each through-hole may be arranged above the corresponding imaging pin-hole. An orthogonal projection of the gap between the light-shielding layer and the conductive connection pattern onto the base substrate may be completely located within an orthogonal projection of the anode onto the base substrate, so as to prevent the occurrence of the light leakage. In a possible embodiment of the present disclosure, the anode may be made of a metal material.

In a possible embodiment of the present disclosure, a part of a surface of the light-shielding layer in proximity to the gap and adjacent to the anode may be uneven, so as to prevent the light from being reflected by the portion of the light-shielding layer in proximity to the gap toward the fingerprint sensor through the gap, thereby to prevent the collection of the fingerprint from being adversely affected.

In the embodiments of the present disclosure, the display substrate may further include the fingerprint sensor arranged on the base substrate and at a side of the light-shielding layer away from the light-emitting units. In a possible embodiment of the present disclosure, the fingerprint sensor and the light-shielding layer may be arranged at different sides of the base substrate.

The structure of the display substrate will be described hereinafter in more details.

Figure 3:
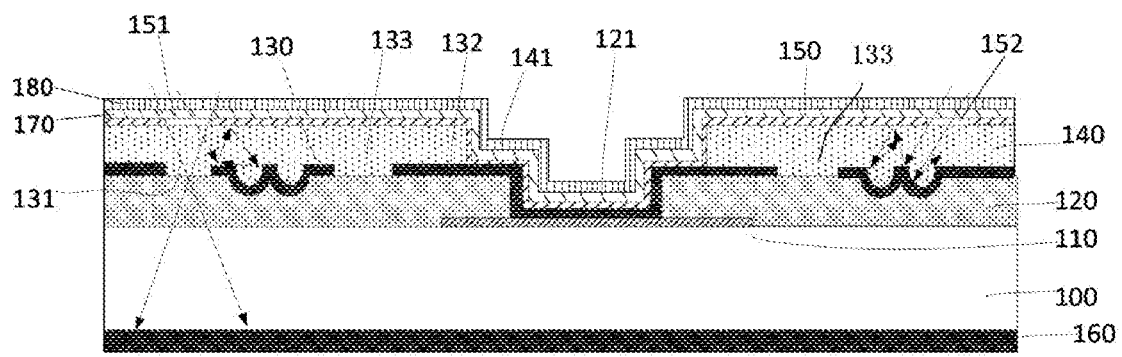
FIG. 3 is a schematic view showing a display substrate according to one embodiment of the present disclosure.

As shown in FIG. 3, the display substrate may include: the base substrate 100; a thin film transistor arranged on the base substrate 100 and including a drain electrode 110 (of course, the thin film transistor further includes a gate electrode, an active layer and a source electrode which are not shown for ease of description); a first insulation layer 120 arranged on the thin film transistor, a first connection hole 121 being formed in the first insulation layer 120 and arranged above the drain electrode 110; the light-shielding layer 130 and the conductive connection pattern 132 arranged on the first insulation layer 120, at least a part of a surface of the light-shielding layer 130 being uneven, the plurality of imaging pin-holes 131 being formed in the light-shielding layer 130, the light-shielding layer 130 being made of a conductive material, e.g., metal, the conductive connection pattern 132 being arranged at a same layer as and not connected to the light-shielding layer 130, at least a part of the conductive connection pattern 132 being arranged in the first connection hole 121, and the conductive connection pattern 132 being connected to the drain electrode 110 via the first connection hole 121; a second insulation layer 140 arranged on the light-shielding layer 130, a second connection hole 141 being formed in the second insulation layer 140 and arranged above the conductive connection pattern 132; the anode 150 arranged on the second insulation layer 140 and connected to the conductive connection pattern 132 via the second connection hole 141, the anode 150 being provided with the plurality of through-holes 151 each arranged above the corresponding imaging pin-hole 131, a gap 152 being formed between anodes of different pixel units, and an orthogonal projection of the gap 133 between the light-shielding layer 130 and the conductive connection pattern 132 onto the base substrate 100 being completely arranged within an orthogonal projection of the anode 150 onto the base substrate 100 (i.e., the anode 150 is arranged in such a manner as to cover the gap 133 between the light-shielding layer 130 and the conductive connection pattern 132); the light-emitting layer 170 arranged on the anode 150; the cathode 180 arranged on the light-emitting layer (the anode 150, the light-emitting layer 170 and the cathode 180 together form the light-emitting unit), an orthogonal projection of each imaging pin-hole 131 onto the base substrate not overlapping an orthogonal projection of the active light-emitting region of the corresponding light-emitting unit onto the base substrate 100; and the fingerprint sensor 160 arranged on the base substrate 100.

As shown in FIG. 3, when the light reaches the portion of the light-shielding layer 130 in proximity to the gap 133, it may be scattered by the uneven surface of the light-shielding layer 130. Hence, it is able to prevent the light from being transmitted along an optical waveguide formed between the anode 150 and the light-shielding layer 130, and prevent the light from entering the gap 133 as possible, thereby to prevent the collection of the fingerprint from being adversely affected.

In FIG. 3, a part of a surface of the first insulation layer 120 may be provided with an uneven structure, so that a part of the light-shielding layer 130 on the first insulation layer 120 may be also provided with the uneven surface.

Figure 4:
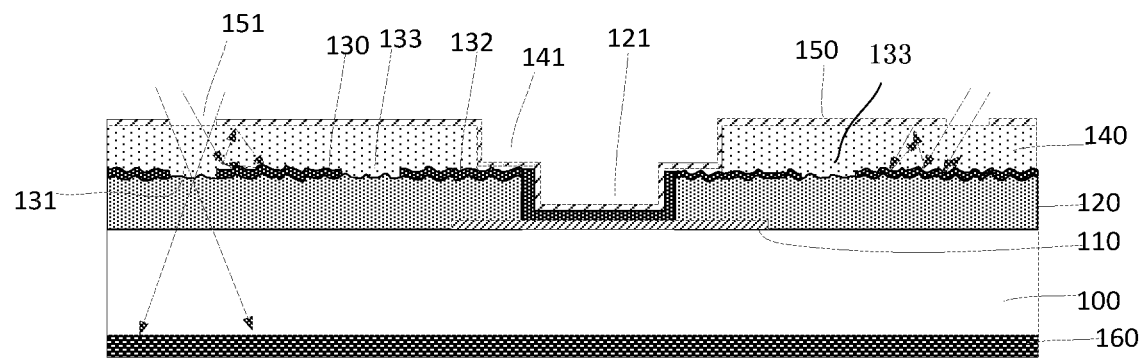
FIG. 4 is another schematic view showing the display substrate according to one embodiment of the present disclosure.

The display substrate in FIG. 4 differs from that in FIG. 3 in that the entire surface of the first insulation layer 120 is uneven, so the entire surface of the light-shielding layer 130 on the first insulation layer 120 is uneven too.

Figure 5:
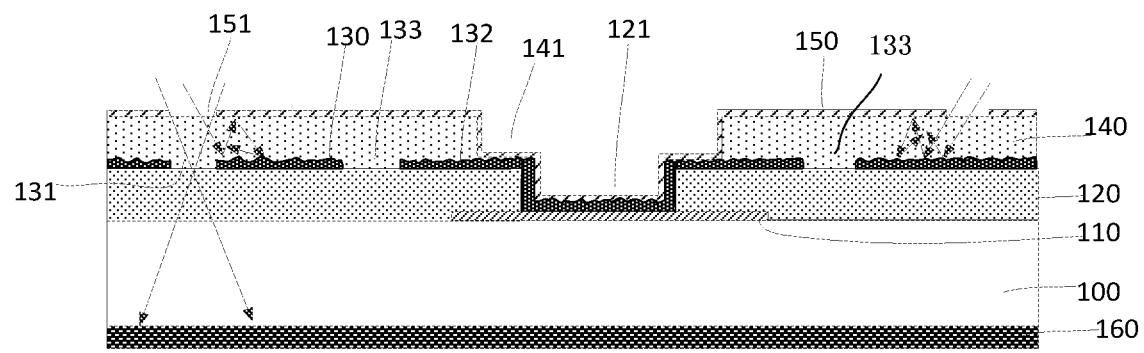
FIG. 5 is yet another schematic view showing the display substrate according to one embodiment of the present disclosure.

The display substrate in FIG. 5 differs from that in FIG. 3 in that the uneven structure is directly formed at the entire surface of the light-shielding layer 130.

The present disclosure further provides in some embodiments a display device including the above-mentioned display substrate.

The present disclosure further provides in some embodiments a method for manufacturing a display substrate, including: Step 11 of providing a base substrate; and Step 12 of forming a light-shielding layer and a plurality of light-emitting units at a display region of the base substrate. A plurality of imaging pin-holes is formed in the light-shielding layer, an orthogonal projection of each imaging pin-hole onto the base substrate does not overlap an orthogonal projection of an active light-emitting region of the light-emitting unit onto the base substrate, and at least a part of a surface of the light-shielding layer adjacent to the light-emitting units is uneven.

According to the embodiments of the present disclosure, the imaging pin-holes for the collection of a fingerprint are located at a display region of the display substrate, so it is able to achieve the in-screen fingerprint identification without any necessity to form the imaging pin-holes at a non-display region of the display substrate, thereby to reduce a size of a bezel of a display device including the display substrate, achieve a display function in a full screen manner, and provide better resistance to oil, water and dust. In addition, at least a part of the surface of the light-shielding layer adjacent to the light-emitting unit is uneven, so it is able to reduce the reflectivity of the surface of the light-shielding layer, and prevent the stray light from being reflected by the light-shielding layer and entering a fingerprint sensor through the imaging pin-holes or any other portions of the light-shielding layer where the light leakage may occur, thereby to collect the fingerprint in a clearer manner and perform the fingerprint identification accurately.

In a possible embodiment of the present disclosure, the entire surface of the light-shielding layer adjacent to the light-emitting units may be uneven.

In some embodiments of the present disclosure, each light-emitting unit may include an anode, a light-emitting layer and a cathode. Prior to forming the light-shielding layer and the plurality of light-emitting units at the display region of the base substrate, the method may further include forming a thin film transistor on the base substrate. The thin film transistor may include a drain electrode, and the light-shielding layer may be arranged between the drain electrode and the anode of the light-emitting unit. The method may further include forming a conductive connection pattern on the base substrate. The conductive connection pattern may be arranged at a same layer as and not connected to the light-shielding layer, and at least a part of the conductive connection pattern is arranged in the first connection hole and configured to connect the anode and the drain electrode. The anode may be a reflective anode provided with a plurality of through-holes corresponding to the imaging pin-holes respectively and each arranged above the corresponding imaging pin-hole, and an orthogonal projection of a gap between the light-shielding layer and the conductive connection pattern onto the base substrate may be completely located within an orthogonal projection of the anode onto the base substrate.

In some embodiments of the present disclosure, the method may specifically include: Step 21 of providing the base substrate; Step 22 of forming a thin film transistor at a side of the base substrate, the thin film transistor including a drain electrode; Step 23 of forming a first insulation layer on the thin film transistor, a first connection hole being formed in the first insulation layer and arranged above the drain electrode; Step 24 of forming the light-shielding layer and the conductive connection pattern on the first insulation layer through a single patterning process, at least a part of a surface of the light-shielding layer adjacent to the light-emitting layer being uneven, the plurality of imaging pin-holes being formed in the light-shielding layer, an orthogonal projection of each imaging pin-hole onto the base substrate not overlapping an orthogonal projection of an active light-emitting region of the corresponding light-emitting unit onto the base substrate, the light-shielding layer being made of a conductive material, e.g., metal, the conductive connection pattern being arranged at a same layer as and not connected to the light-shielding layer, at least a part of the conductive connection pattern being arranged in the first connection hole, and the conductive connection pattern being connected to the drain electrode via the first connection hole; Step 25 of forming a second insulation layer on the light-shielding layer, a second connection hole being formed in the second insulation layer and arranged above the conductive connection pattern; Step 26 of forming an anode on the second insulation layer, the anode being connected to the conductive connection pattern via the second connection hole, the anode being a reflective anode and provided with a plurality of through-holes, the through-holes corresponding to the imaging pin-holes respectively and each arranged above the corresponding imaging pin-hole, and an orthogonal projection of a gap between the light-shielding layer and the conductive connection pattern onto the base substrate being completely arranged within an orthogonal projection of the anode onto the base substrate; Step 27 of forming a light-emitting layer on the anode; Step 28 of forming a cathode on the light-emitting layer; and Step 29 of forming a fingerprint sensor at the other side of the base substrate.

Figure 6:
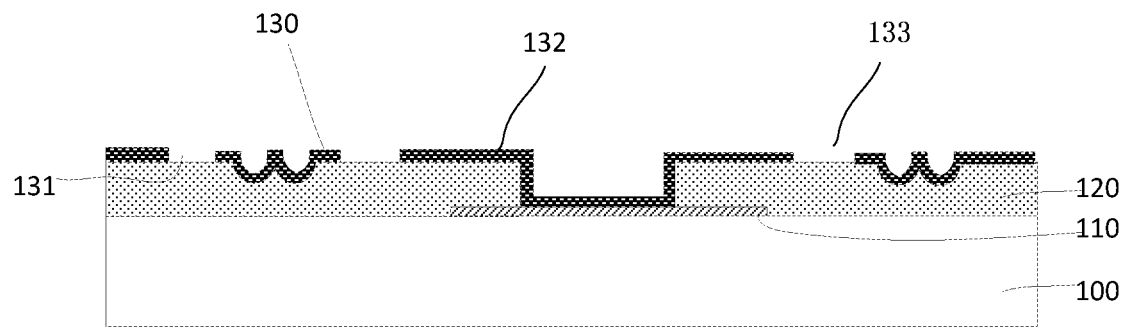
FIG. 6 is a schematic view showing the formation of the light-shielding layer according to one embodiment of the present disclosure.

In some embodiments of the present disclosure, as shown in FIG. 6, the forming the first insulation layer on the thin film transistor may include forming an insulation film, and patterning the insulation film through a grey-tone or half-tone mask plate so as to form a pattern of the first insulation layer 120 with the first connection hole 121. At least a part of an upper surface of the first insulation layer adjacent to the light-shielding layer may be provided with an uneven structure.

Then, the light-shielding layer 130 and the conductive connection pattern 132 may be formed on the first insulation layer 120, so as to provide a part of the light-shielding layer 130 with an uneven surface.

Figure 7:
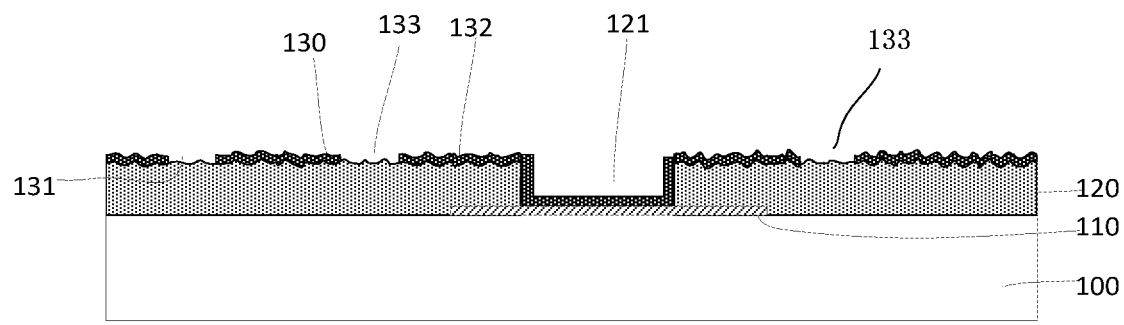
FIG. 7 is another schematic view showing the formation of the light-shielding layer according to one embodiment of the present disclosure.

In some embodiments of the present disclosure, as shown in FIG. 7, the forming the first insulation layer on the thin film transistor may include forming an insulation film, patterning the insulation film so as to form a pattern of the first insulation layer 120 with the first connection hole 121, and subjecting the first insulation layer 120 to ashing treatment so as to provide an entire upper surface of the first insulation layer 120 with an uneven structure.

Then, the light-shielding layer 130 and the conductive connection pattern 132 may be formed on the first insulation layer 120, so as to provide the entire light-shielding layer 130 with an uneven surface.

As mentioned above, the first insulation layer with an uneven surface may be formed at first, so as to provide the light-shielding layer on the first insulation layer with an uneven surface.

Figure 8:
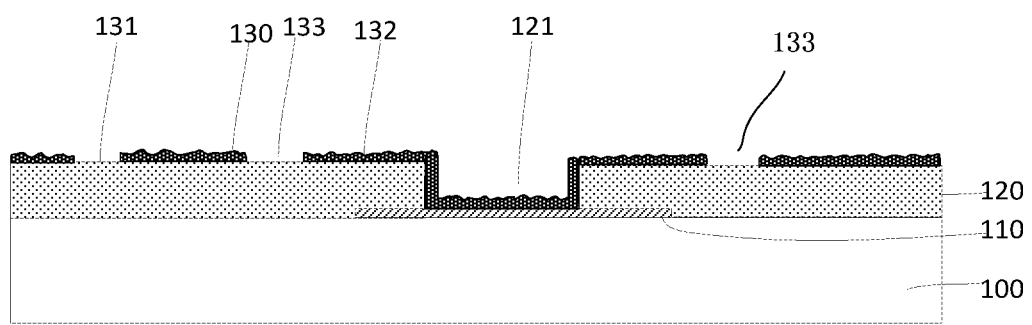
FIG. 8 is yet another schematic view showing the formation of the light-shielding layer according to one embodiment of the present disclosure.

In some embodiment of the present disclosure, the forming the light-shielding layer on the first insulation layer may include forming a conductive film (e.g., a metal film), and patterning the conductive film through a grey-tone or half-tone mask plate so as to form the light-shielding layer 130 and the conductive connection pattern 132 (as shown in FIG. 8). The plurality of imaging pin-holes may be formed in the light-shielding layer 130, and an upper surface of the light-shielding layer may be provided with an uneven structure.

As mentioned above, the metal film may be patterned through the grey-tone or half-tone mask plate having a fully-transparent region, a partially-transparent region and a nontransparent region, so as to form the light-shielding layer and the conductive connection pattern. The plurality of imaging pin-holes may be formed in the light-shielding layer, and the upper surface of the light-shielding layer may be provided with an uneven structure.

In some embodiments of the present disclosure, the forming the light-shielding layer on the first insulation layer may include: patterning the conductive film so as to form the light-shielding layer 130 and the conductive connection pattern 132, the plurality of imaging pin-holes being formed in the light-shielding layer 130; and etching a surface of the light-shielding layer 130 and a surface of the conductive connection pattern 132 through an etching process so as to provide each of the light-shielding layer 130 and the conductive connection pattern 132 with an uneven surface (as shown in FIG. 8).

As mentioned above, the light-shielding layer 130 with an uneven surface may be formed directly.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a light-shielding layer and a plurality of light-emitting units arranged at a display region of the base substrate, wherein:
   a plurality of imaging pin-holes is formed in the light-shielding layer,
   an orthogonal projection of the plurality of imaging pin-holes onto the base substrate does not overlap an orthogonal projection of an active light-emitting region of the plurality of light-emitting units onto the base substrate, and
   at least a part of a surface of the light-shielding layer adjacent to the plurality of light-emitting units is uneven;
   wherein each light-emitting unit comprises an anode, and a through-hole is formed in the anode.

2. The display substrate according to claim 1, wherein an entire surface of a light-emitting layer adjacent to the plurality of light-emitting units is uneven.

3. The display substrate according to claim 1, wherein each light-emitting unit further comprises a light-emitting layer and a cathode, and wherein the display substrate further comprises:
   a thin film transistor comprising a drain electrode, the light-shielding layer being arranged between the drain electrode and the anode; and
   a conductive connection pattern arranged at a same layer as the light-shielding layer but not connected to the light-shielding layer and configured to connect the anode and the drain electrode.

4. The display substrate according to claim 3, wherein the anode is a reflective anode, and a plurality of through-holes corresponding to the plurality of imaging pin-holes respectively are formed in the anode and arranged above the plurality of imaging pin-holes, and an orthogonal projection of a gap between the light-shielding layer and the conductive connection pattern onto the base substrate is completely located within an orthogonal projection of the anode onto the base substrate.

5. The display substrate according to claim 4, wherein the light-shielding layer is made of a conductive material that comprises a metal material.

6. The display substrate according to claim 1, further comprising a fingerprint sensor arranged on the base substrate and at a side of the light-shielding layer away from the plurality of light-emitting units.

7. The display substrate according to claim 3, wherein the active light-emitting region of the plurality of light-emitting units is a region where an anode completely overlaps the light-emitting layer.

8. A display substrate, comprising:
a base substrate;
a thin film transistor arranged at a first side of the base substrate and comprising a drain electrode;
a first insulation layer arranged on the thin film transistor, a first connection hole being formed in the first insulation layer and arranged above the drain electrode;
a light-shielding layer and a conductive connection pattern arranged on the first insulation layer, at least a part of a surface of the light-shielding layer adjacent to a light-emitting layer being uneven, a plurality of imaging pin-holes being formed in the light-shielding layer, an orthogonal projection of the plurality of imaging pin-holes onto the base substrate not overlapping an orthogonal projection of an active light-emitting region of a plurality of light-emitting units onto the base substrate, the light-shielding layer being made of a conductive material, the conductive connection pattern being arranged at a same layer as and not connected to the light-shielding layer, at least a part of the conductive connection pattern being arranged in the first connection hole, and the conductive connection pattern being connected to the drain electrode via the first connection hole;
a second insulation layer arranged on the light-shielding layer, a second connection hole being formed in the second insulation layer and arranged above the conductive connection pattern;
an anode arranged on the second insulation layer and connected to the conductive connection pattern via the second connection hole, the anode being a reflective anode and provided with a plurality of through-holes, the plurality of through-holes corresponding to the plurality of imaging pin-holes respectively and arranged above the plurality of imaging pin-holes, and an orthogonal projection of a gap between the light-shielding layer and the conductive connection pattern onto the base substrate being completely arranged within an orthogonal projection of the anode onto the base substrate;
a light-emitting layer arranged on the anode;
a cathode arranged on the light-emitting layer; and
a fingerprint sensor arranged at a second side of the base substrate.

9. A display device, comprising the display substrate according to claim 1.

10. A method for manufacturing a display substrate, comprising:
providing a base substrate; and
forming a light-shielding layer and a plurality of light-emitting units at a display region of the base substrate, wherein a plurality of imaging pin-holes is formed in the light-shielding layer, an orthogonal projection of the plurality of imaging pin-hole onto the base substrate does not overlap an orthogonal projection of an active light-emitting region of the plurality of light-emitting units onto the base substrate, and at least a part of a surface of the light-shielding layer adjacent to the plurality of light-emitting units is uneven;
wherein each light-emitting unit comprises an anode, and a through-hole is formed in the anode.

11. The method according to claim 10, wherein an entire surface of the light-shielding layer adjacent to the plurality of light-emitting units is uneven.

12. The method according to claim 10, wherein each light-emitting unit further comprises a light-emitting layer and a cathode,
wherein prior to forming the light-shielding layer and the plurality of light-emitting units at the display region of the base substrate, the method further comprises forming a thin film transistor on the base substrate, the thin film transistor comprises a drain electrode, and the light-shielding layer is arranged between the drain electrode and the anode of the light-emitting unit,
wherein the method further comprises forming a conductive connection pattern on the base substrate, and
wherein the conductive connection pattern is arranged at a same layer as the light-shielding layer and not connected to the light-shielding layer, and is configured to connect the anode and the drain electrode.

13. The method according to claim 12, wherein the anode is a reflective anode, and a plurality of through-holes corresponding to the plurality of imaging pin-holes respectively are formed in the anode and arranged above the plurality of imaging pin-holes, and an orthogonal projection of a gap between the light-shielding layer and the conductive connection pattern onto the base substrate is completely located within an orthogonal projection of the anode onto the base substrate.

14. The method according to claim 13, comprising:
providing the base substrate;
forming a thin film transistor at a side of the base substrate, the thin film transistor comprising a drain electrode;
forming a first insulation layer on the thin film transistor, a first connection hole being formed in the first insulation layer and arranged above the drain electrode;
forming the light-shielding layer and the conductive connection pattern on the first insulation layer through a single patterning process, at least a part of a surface of a light-shielding layer adjacent to the light-emitting layer being uneven, the plurality of imaging pin-holes being formed in the light-shielding layer, an orthogonal projection of the plurality of imaging pin-holes onto the base substrate not overlapping an orthogonal projection of an active light-emitting region of the plurality of light-emitting units onto the base substrate, the light-shielding layer being made of a conductive material, the conductive connection pattern being arranged at a same layer as and not connected to the light-shielding layer, at least a part of the conductive connection pattern being arranged in the first connection hole, and the conductive connection pattern being connected to the drain electrode via the first connection hole;

forming a second insulation layer on the light-shielding layer, a second connection hole being formed in the second insulation layer and arranged above the conductive connection pattern;

forming an anode on the second insulation layer, the anode being connected to the conductive connection pattern via the second connection hole, the anode being a reflective anode and provided with a plurality of through-holes, the plurality of through-holes corresponding to the plurality of imaging pin-holes respectively and arranged above the plurality of imaging pin-holes, and an orthogonal projection of a gap between the light-shielding layer and the conductive connection pattern onto the base substrate being completely arranged within an orthogonal projection of the anode onto the base substrate;

forming the light-emitting layer on the anode;

forming a cathode on the light-emitting layer; and forming a fingerprint sensor at the other side of the base substrate.

15. The method according to claim 14, wherein the conductive material is a metal material.

16. The method according to claim 14, wherein forming the first insulation layer on the thin film transistor comprises forming an insulation film, and patterning the insulation film through a grey-tone or half-tone mask plate to form a pattern of the first insulation layer, the first insulation layer having the first connection hole, wherein at least a part of an upper surface of the first insulation layer adjacent to the light-shielding layer is provided with an uneven structure.

17. The method according to claim 14, wherein forming the first insulation layer on the thin film transistor comprises forming an insulation film, patterning the insulation film to form a pattern of the first insulation layer, the first insulation layer having the first connection hole, and subjecting the first insulation layer to ashing treatment to provide an entire upper surface of the first insulation layer with an uneven structure.

18. The method according to claim 14, wherein forming the light-shielding layer on the first insulation layer comprises forming a conductive film, and patterning the conductive film through a grey-tone or half-tone mask plate to form the light-shielding layer and the conductive connection pattern, wherein the plurality of imaging pin-holes is formed in the light-shielding layer, and an upper surface of the light-shielding layer is provided with an uneven structure.

19. The method according to claim 14, wherein forming the light-shielding layer on the first insulation layer comprises:

patterning a conductive film to form the light-shielding layer and the conductive connection pattern, the plurality of imaging pin-holes being formed in the light-shielding layer; and etching a surface of the light-shielding layer and a surface of the conductive connection pattern through an etching process to provide an entire surface of the light-shielding layer and the conductive connection pattern with an uneven structure.

20. The method according to claim 10, wherein the active light-emitting region of the plurality of light-emitting units is a region where the anode completely overlaps a light-emitting layer.

* * * * *